(12) United States Patent
Duffy et al.

(10) Patent No.: US 8,159,301 B1
(45) Date of Patent: Apr. 17, 2012

(54) DIFFERENTIAL AMPLIFIER WITH HYSTERESIS

(75) Inventors: Paul Duffy, Dublin (IE); Edward Cullen, Clane (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/872,145

(22) Filed: Aug. 31, 2010

(51) Int. Cl.
*H03F 3/45* (2006.01)
(52) U.S. Cl. ........................................ 330/253; 330/261
(58) Field of Classification Search .................. 330/69, 330/253, 258, 261
See application file for complete search history.

(56) References Cited

U.S. PATENT DOCUMENTS

| | | | |
|---|---|---|---|
| 4,958,133 A | | 9/1990 | Bazes |
| 5,515,003 A | * | 5/1996 | Kimura .......................... 330/253 |
| 5,631,607 A | * | 5/1997 | Huijsing et al. ............... 330/253 |
| 5,729,178 A | * | 3/1998 | Park et al. ....................... 330/258 |
| 6,304,141 B1 | * | 10/2001 | Kennedy et al. .............. 330/253 |

* cited by examiner

*Primary Examiner* — Henry Choe
(74) *Attorney, Agent, or Firm* — Robert M. Brush; Gerald Chan

(57) ABSTRACT

An amplifier circuit having a differential input and an amplifier output is provided. In some examples, the amplifier circuit includes a first input stage having a first complementary transistor pair providing a first input and a first output, the first input being a first half of the differential input; a second input stage having a second complementary transistor pair providing a second input and a second output, the second input being a second half of the differential input; an output stage coupled to the first input stage and the second input stage and providing the amplifier output; and a transistor coupled in parallel to one transistor in one of the first complementary transistor pair or the second complementary transistor pair.

17 Claims, 4 Drawing Sheets

DIFFERENTIAL AMPLIFIER WITH HYSTERESIS

FIELD OF THE INVENTION

One or more aspects of the present invention relate generally to electrical circuits and, more particularly, to a differential amplifier with hysteresis.

BACKGROUND

In the design of complementary metal-oxide semiconductor (CMOS) integrated circuits, differential amplifiers are used for various applications, such as digital or analog amplifiers, comparators, buffer stages, and the like. For example, in a digital integrated circuit (IC), input receivers on the chip may employ differential amplifiers for buffering digital input signals to make input signal levels from external sources compatible with internal switching levels. Conventional differential amplifier circuits do not have hysteresis. That is, changes in the output of the differential amplifier are synchronized with changes in the input (i.e., the output of the amplifier does not lag the input of the amplifier). Without hysteresis, small undesired variations in input voltage (e.g., due to noise) can cause the output voltage of the amplifier to change in a non-ideal fashion.

Consider a digital input buffer where one input of the differential amplifier is coupled to a reference voltage, and the other input of the differential amplifier is configured to receive a digital input signal. In some circumstances, the two input voltages may be fairly close in value. For example, when the digital input is floating, the logic level of the digital input is typically pulled to the reference voltage by a termination resistor. Since the output of the differential amplifier changes state when there is any difference between the two input voltages, variations on either input due to noise can cause undesired switching at the output Therefore, it is desirable to compensate for noise on the inputs of a differential amplifier. It is further desirable for an input receiver in an IC to compensate for noise, rather than forcing the user of the IC to compensate for such noise at a board-level.

Accordingly, there exists a need in the art for a method and apparatus for providing a differential amplifier with hysteresis.

SUMMARY

In some embodiments, an amplifier circuit having a differential input and an amplifier output is provided. The amplifier circuit can include a first input stage having a first complementary transistor pair providing a first input and a first output, the first input being a first half of the differential input; a second input stage having a second complementary transistor pair providing a second input and a second output, the second input being a second half of the differential input; an output stage coupled to the first input stage and the second input stage and providing the amplifier output; and a transistor coupled in parallel to one transistor in one of the first complementary transistor pair or the second complementary transistor pair. The transistor can be an N-channel metal oxide semiconductor (NMOS) transistor coupled in parallel to another NMOS transistor in the first complementary transistor pair or the second complementary transistor pair, for example. Alternatively, the transistor can be a P-channel metal oxide semiconductor (PMOS) transistor coupled in parallel to another PMOS transistor in the first complementary transistor pair or the second complementary transistor pair. The output stage can include: a first output stage having a third input coupled to the first output and a third output providing a bias voltage; and a second output stage having a fourth input coupled to the second output and a fourth output, the fourth output being the amplifier output. The amplifier circuit can further include a current source configured to provide current to the first input stage and the second input stage.

In some embodiments, an amplifier circuit having a differential input and an amplifier output is provided. The amplifier circuit can include a first input stage having a first complementary transistor pair providing a first input and a first output, the first input being a first half of the differential input; a second input stage having a second complementary transistor pair providing a second input and a second output, the second input being a second half of the differential input; an output stage coupled to the first input stage and the second input stage and providing the amplifier output; a first hysteresis circuit coupled in parallel with one transistor in the first complementary transistor pair, the first hysteresis circuit including a first transistor; a second hysteresis circuit coupled in parallel with one transistor in the second complementary transistor pair, the second hysteresis circuit including a second transistor; and a control circuit configured to selectively enable either the first transistor or the second transistor in response to the amplifier output.

The first hysteresis circuit can include a first switch in series with the first transistor, and the second hysteresis circuit can include a second switch in series with the second transistor. The control circuit can selectively enable either the first transistor or the second transistor by selectively activating either the first switch or the second switch, respectively. The control circuit can include first and second logic gates having outputs coupled to first and second inverters, respectively, and the first inputs of the first and second logic gates can receive the amplifier output and a logical inversion of the amplifier output, respectively. Second inputs of the first and second logic gates can receive a hysteresis enable signal. The output stage can include: a first output stage having a third input coupled to the first output and a third output providing a bias voltage; and a second output stage having a fourth input coupled to the second output and a fourth output, the fourth output being the amplifier output. The amplifier circuit can include a current source configured to provide current to the first input stage and the second input stage.

In some embodiments, an amplifier circuit having a differential input and an amplifier output is described. The amplifier circuit can include means for providing a first input stage having a first input and a first output, the first input being a first half of the differential input; means for providing a second input stage having a second input and a second output, the second input being a second half of the differential input; means for providing an output stage having the amplifier output; and means for effectively increasing a width of one transistor in one of the first complementary transistor pair or the second complementary transistor pair. The means for effectively increasing can include an N-channel metal oxide semiconductor (NMOS) transistor coupled in parallel to another NMOS transistor, for example. Alternatively, the means for effectively increasing can include a P-channel metal oxide semiconductor (PMOS) transistor coupled in parallel to another PMOS transistor. The means for providing the amplifier output can include means for providing a bias voltage. The amplifier circuit can further include means for providing current to the first input stage and the second input stage.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

DETAILED DESCRIPTION

Figure 1:
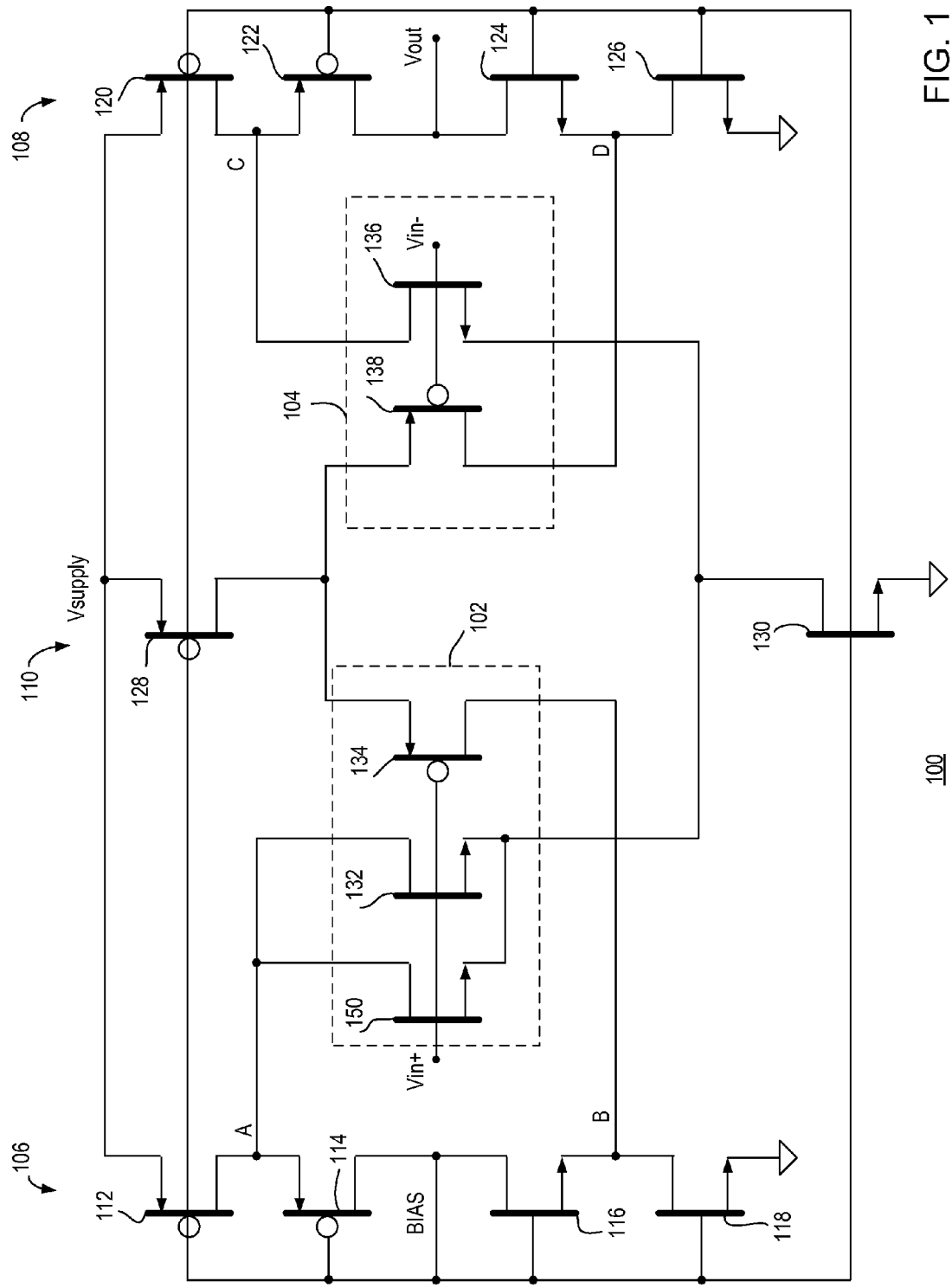
FIG. 1 is a schematic diagram depicting an embodiment of a differential amplifier.

FIG. 1 is a schematic diagram depicting an embodiment of a differential amplifier 100. The differential amplifier 100 includes a first input stage 102, a second input stage 104, a first output stage 106, a second output stage 108, and a current source 110. The first input stage 102 provides a first differential input Vin+, and the second input stage 104 provides a second differential input Vin−. An output of the first input stage 102 (labeled as junctions A and B) is coupled to an input of the first output stage 106. An output of the second input stage 104 (labeled as junctions C and D) is coupled to an input of the second output stage 108. An output of the first output stage 106 (labeled as BIAS) provides a bias voltage for the differential amplifier 100. An output of the second output stage 108 (labeled as Vout) provides a single-ended output for the differential amplifier 100. The first output stage 106 and the second output stage 108 are collectively referred to as an output stage. The current source 110 provides current to the first input stage and the second input stage.

The first output stage 106 includes P-channel metal-oxide semiconductor (PMOS) transistors 112 and 114, and N-channel metal-oxide semiconductor (NMOS) transistors 116 and 118. A source of the PMOS transistor 112 is coupled to a supply voltage Vsupply. A drain of the PMOS transistor 112 is coupled to a source of the PMOS transistor 114 and to the junction A. A drain of the PMOS transistor 114 is coupled to a drain of the NMOS transistor 116. A source of the NMOS transistor 116 is coupled to a drain of the NMOS transistor 118, as well as the junction B. A source of the NMOS transistor 118 is coupled to a return voltage such as, for example, electrical ground. While electrical ground will be used by way of example, it is to be understood that the return voltage can be a potential other than electrical ground. Gates of the PMOS transistors 112 and 114 and the NMOS transistors 116 and 118 are each coupled to the drain of the PMOS transistor 114 and the drain of the NMOS transistor 116 to form the junction BIAS.

Similarly, the second output stage 108 includes PMOS transistors 120 and 122, and N-MOS transistors 124 and 126. A source of the PMOS transistor 120 is coupled to a supply voltage Vsupply. A drain of the PMOS transistor 120 is coupled to a source of the PMOS transistor 122 and to the junction C. A drain of the PMOS transistor 122 is coupled to a drain of the NMOS transistor 124. A source of the NMOS transistor 124 is coupled to a drain of the NMOS transistor 126, as well as the junction D. A source of the NMOS transistor 126 is coupled to electrical ground. Gates of the PMOS transistors 120 and 122 and the NMOS transistors 124 and 126 are each coupled to the junction BIAS. The drain of the PMOS transistor 122 and the drain of the NMOS transistor 124 provide the output Vout.

The current source 110 includes a PMOS transistor 128 and an NMOS transistor 130. A source of the PMOS transistor 128 is coupled to the supply voltage Vsupply. A source of the NMOS transistor 130 is coupled to electrical ground. Gates of the PMOS transistor 128 and the NMOS transistor 130 are coupled to the junction BIAS.

The first input stage 102 includes an NMOS transistor 132 and a PMOS transistor 134. A drain of the NMOS transistor 132 is coupled to the junction A. A source of the NMOS transistor 132 is coupled to a drain of the NMOS transistor 130 in the current source 110. A source of the PMOS transistor 134 is coupled to a drain of the PMOS transistor 128 in the current source 110. A drain of the PMOS transistor 134 is coupled to the junction B. Gates of the NMOS transistor 132 and the PMOS transistor 134 provide the input Vin+. The NMOS transistor 132 and the PMOS transistor 134 comprise a complementary transistor pair (referred to herein as a first complementary transistor pair). The first complementary transistor pair includes the Vin+ input (first input) and an output (the A and B junctions comprising a first output).

Similarly, the second input stage 104 includes an NMOS transistor 136 and a PMOS transistor 138. A drain of the NMOS transistor 136 is coupled to the junction C. A source of the NMOS transistor 136 is coupled to a drain of the NMOS transistor 130 in the current source 110. A source of the PMOS transistor 138 is coupled to a drain of the PMOS transistor 128 in the current source 110. A drain of the PMOS transistor 138 is coupled to the junction D. Gates of the NMOS transistor 136 and the PMOS transistor 138 provide the input Vin−. The NMOS transistor 136 and the PMOS transistor 138 comprise a complementary transistor pair (referred to herein as a second complementary transistor pair). The second complementary transistor pair includes the Vin− input (first input) and an output (the C and D junctions comprising a second output).

In operation, the differential amplifier 100 receives two differential inputs Vin+ and Vin−, and produces a single-ended output Vout such that Vout equals a gain factor times the difference between Vin+ and Vin−. The BIAS junction provides the bias voltage for the differential amplifier. The bias is generated by the negative feedback from the drains of transistors 114 and 116 to the gates of transistors 112-118, 120-126, and 128-130. This negative feedback causes the bias voltage to be stable. Because the bias for the differential amplifier 100 is generated internally, the amplifier provides a self-bias and does not require an external biasing scheme. Further operational details of differential amplification can be found in U.S. Pat. No. 4,958,133, which is incorporated by reference herein.

In an embodiment, the first input stage 102 further includes an NMOS transistor 150 coupled in parallel to the NMOS transistor 132. That is, the gate, the drain, and the source of the transistor 150 are each coupled to the gate, the drain, and the source of the transistor 132, respectively. By adding the NMOS transistor 150 coupled in parallel with the Vin+ input, the first input stage 102 becomes wider than the second input stage 104. For example, assume the width of the NMOS transistor 132 equals the width of the NMOS transistor 136. The addition of the NMOS transistor 150 increases the overall width of the input NMOS on Vin+ so that the effective width of the first input stage 102 is the sum of widths of the NMOS transistors 150 and 132. By increasing the width of the first input stage 102 versus the second input stage 104, the trip point of the differential amplifier 100 (i.e., the point at which the output switches given a particular input) is shifted by shifting the threshold of the NMOS transistor 136 upwards with respect to the NMOS transistor 150/132 combination. The amount of trip point shift added is determined by the width of the additional NMOS transistor 150. As discussed further below, by shifting the trip point, hysteresis can be added to the differential amplifier 100.

More specifically, assume the differential amplifier 100 operates as an input receiver or buffer of a digital input signal. The digital input signal is applied to Vin+, and a reference voltage can be applied to Vin−. The output voltage Vout switches with the input voltage on Vin+ (the voltage levels at Vin+ and Vout can be different and is controlled by the gain of the differential amplifier and the reference voltage on Vin−). Assume that during a period of time, the input signal at Vin+ is at a logic high voltage level, causing the output voltage at Vout to be at a logic high voltage level. Without the NMOS transistor 150, a variation in the reference voltage at Vin− may be such that the output voltage at Vout changes to a logic low voltage level despite the fact that the input voltage at Vin+ did not change. Since the output voltage should switch with the input voltage, this is undesirable. The reference voltage at Vin− may have variations due to noise. With the addition of the NMOS transistor 150, the threshold of the NMOS transistor 136 is increased with respect to the NMOS transistor 132/150 combination. This makes the differential amplifier respond to a rising edge on the input voltage at Vin+ sooner than an edge of the reference voltage on Vin− (a shift in trip point). Thus, the output voltage Vout is less susceptible to switching on variations of the reference voltage on Vin−. The amount of trip point shift is selectable based on the width of the transistor 150. Notably, the differential amplifier 100 can have various applications in addition to the input receiver or buffer, which is described above by way of example.

By way of example, the NMOS transistor 150 is shown coupled in parallel with the NMOS transistor 132. It is to be understood that the NMOS transistor 150 can be coupled in parallel to the NMOS transistor 136 in the second input stage 104 and would operate similarly as described above, except for reversing the roles of Vin+ and Vin−.

Figure 2:
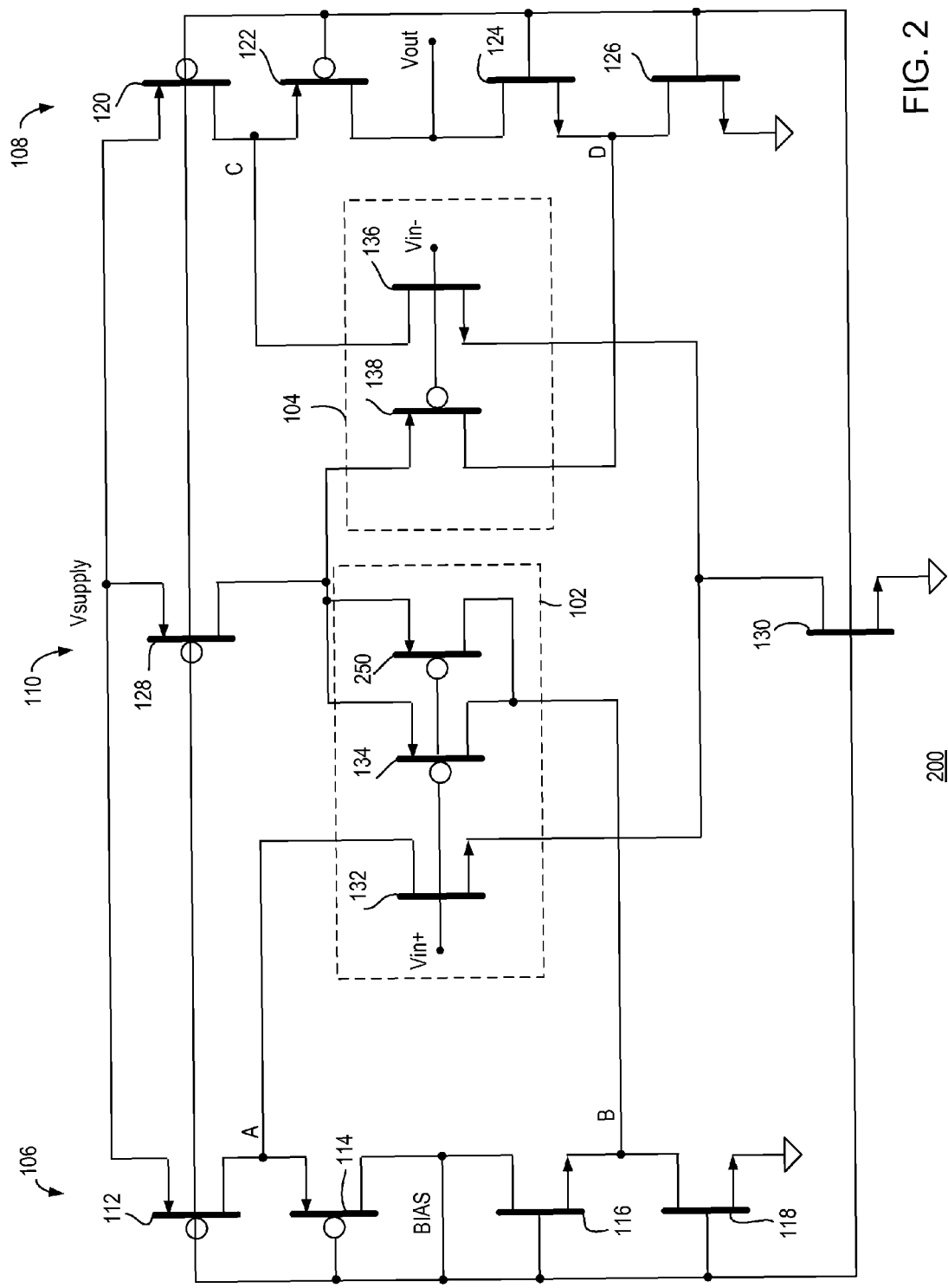
FIG. 2 is a schematic diagram depicting another embodiment of a differential amplifier.

FIG. 2 is a schematic diagram depicting another embodiment of a differential amplifier 200. Elements of FIG. 2 that are the same or similar to those of FIG. 1 are designated with identical reference numerals and described in detail above. In the embodiment of FIG. 1, an NMOS transistor 150 was coupled in parallel with an NMOS transistor in the first or second input stage. In the embodiment of FIG. 2, a PMOS transistor 250 is coupled in parallel to one of the PMOS transistor 134 or 138 (e.g., the PMOS transistor 250 is illustratively shown as being coupled to the PMOS transistor 134). That is, the source, drain, and gate of the PMOS transistor 250 are coupled to the source, drain, and gate of the PMOS transistor 134. The differential amplifier 200 operates similarly to the differential amplifier 100 described above, including the addition of trip point shift as described above.

Accordingly, as shown in FIGS. 1 and 2, a differential amplifier provides a shift in the trip point by coupling a transistor in parallel to one transistor (PMOS or NMOS) in one of the first complementary transistor pair (in the first input stage 102) or the second complementary transistor pair (in the second input stage 104). By dynamically changing the trip point shift, hysteresis can be added to the differential amplifier.

Figure 3:
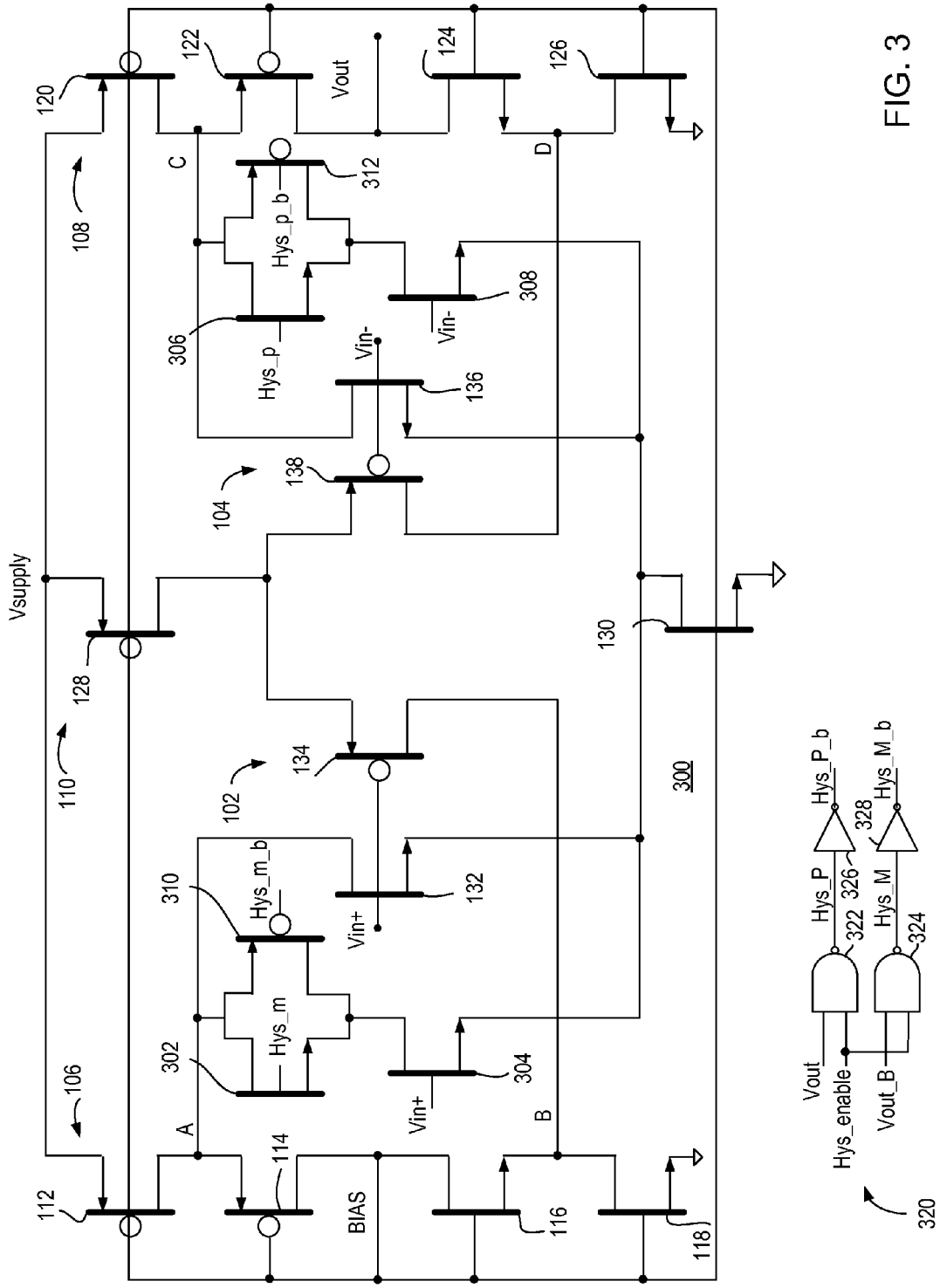
FIG. 3 is a schematic diagram depicting another embodiment of a differential amplifier.

In particular, FIG. 3 is a schematic diagram depicting another embodiment of a differential amplifier 300. In the embodiments of FIGS. 1 and 2, the width of one input stage is made wider than the other input stage on a fixed basis. Thus, the trip point is shifted when the output voltage Vout is at one voltage (e.g., the logic high level). The differential amplifier 300 includes circuitry for dynamically adjusting the width of the first input stage or the second input stage to provide hysteresis when the output voltage is at both extremes (both logic high and logic low). Elements of FIG. 3 that are the same or similar to those of FIGS. 1 and 2 are designated with identical reference numerals, and are described in detail above.

In the embodiment of FIG. 3, hysteresis compensation circuitry includes NMOS transistors 302, 304, 306, and 308, and PMOS transistors 310 and 312. The NMOS transistors 302 and 304, and the PMOS transistor 310 comprise a first hysteresis circuit. The NMOS transistors 306 and 308, and the PMOS transistor 312 comprise a second hysteresis circuit.

The first hysteresis circuit is coupled in parallel with the NMOS transistor 132. More specifically, a drain of the NMOS transistor 302 and a source of the PMOS transistor 310 are coupled to the junction A. A source of the NMOS transistor 302 and a drain of the PMOS transistor 310 are coupled to a drain of the NMOS transistor 304. A source of the NMOS transistor 304 is coupled to the drain of the NMOS transistor 130. The NMOS transistor 302 and the PMOS transistor 310 collectively provide a switch in series with the NMOS transistor 304. A gate of the NMOS transistor 302 receives a signal hys_m. A gate of the PMOS transistor 310 receives a signal hys_m_b. The signals hys_m and hys_m_b are used to activate or deactivate the switch formed by the NMOS transistor 302 and the PMOS transistor 310. A gate of the NMOS transistor 304 receives the input voltage Vin+. Generation of the signals hys_m and hys_m_b is described below.

The second hysteresis circuit is coupled in parallel with the NMOS transistor 136. More specifically, a drain of the NMOS transistor 306 and a source of the PMOS transistor 312 are coupled to the junction C. A source of the NMOS transistor 306 and a drain of the PMOS transistor 312 are coupled to a drain of the NMOS transistor 308. A source of the NMOS transistor 308 is coupled to the drain of the NMOS transistor 130. The NMOS transistor 306 and the PMOS transistor 312 collectively provide a switch in series with the NMOS transistor 308. A gate of the NMOS transistor 306 receives a signal hys_p. A gate of the PMOS transistor 312 receives a signal hys_p_b. The signals hys_p and hys_p_b are used to activate or deactivate the switch formed by the NMOS transistor 306 and the PMOS transistor 312. A gate of the NMOS transistor 308 receives the input voltage Vin−. Generation of the signals hys_p and hys_p_b is described below.

The hysteresis circuitry further includes control logic 320 that generates the hys_p, hys_m, hys_p_b, and hys_m_b signals noted above. The control logic 320 includes NAND gates 322 and 324 (or other logic gates that provide a logical equivalent of NAND gates), and inverters 326 and 328. Inputs of the NAND gate 322 receive the voltage Vout and a hys_enable signal, respectively. Inputs of the NAND gate 324 receive a logic inversion of Vout and the hys_enable signal. An output of the NAND gate 322 is coupled to an input of the inverter 326. An output of the NAND gate 324 is coupled to an input of the inverter 328. The output of the NAND gate 322 provides the signal hys_p, and the output of the NAND gate 324 provides the signal hys_m. An output of the inverter 326 provides the signal hys_p_b, and an output of the inverter 328 provides the signal hys_m_b.

In operation, the control logic 320 selectively switches either the NMOS transistor 304 in parallel with the NMOS transistor 132, or the NMOS transistor 308 in parallel with the NMOS transistor 136. That is, the control logic 320 selectively makes wider either the first input stage 102 or the second input stage 104. As a result, hysteresis is added for both rising and falling edges of the output Vout. The NMOS and PMOS transistors 302 and 310 ensure that the NMOS transistor 304 is coupled in parallel with the NMOS transistor 132 only for rising edges on Vin+. The NMOS and PMOS transistors 306 and 312 ensure that the NMOS transistor 308 is coupled in parallel with the NMOS transistor 136 only for rising edges of Vin− (since Vin+ and Vin− are complements of each other). The dynamic switching is determined by the control logic 320 through the generation of the hys_p, hys_p_b, hys_m, and hys_m_b signals. The output of the differential amplifier 300 (Vout) is used to toggle the hysteresis transistors on and off. Note that hysteresis can be disabled or enabled as a whole through the hys_enable signal input to the control logic 320 (i.e., if hys_enable is a logic high, hysteresis is enabled; if hys_enable is a logic low, hysteresis is disabled). When hysteresis is enabled, as Vout transitions from low to high, the NMOS transistor 304 is enabled and the NMOS transistor 308 is disabled, making the transistor 136 weaker than the transistor 132. When Vout transitions from high to low, the transistor 308 is enabled and the transistor 304 is disabled, making the transistor 132 weaker than the transistor 136.

Figure 4:
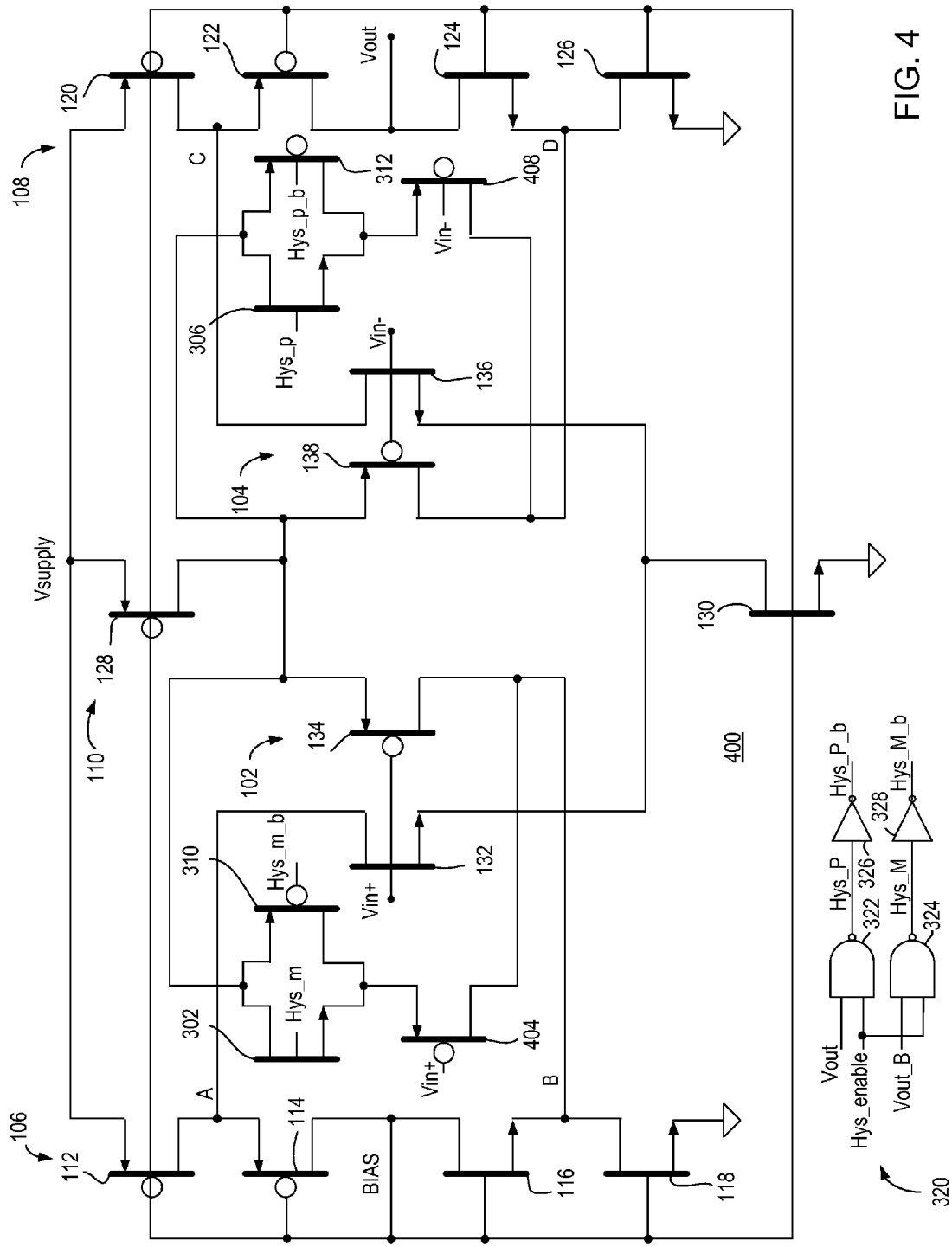
FIG. 4 is a schematic diagram depicting another embodiment of a differential amplifier.

FIG. 4 is a schematic diagram depicting another embodiment of a differential amplifier 400. Elements of FIG. 4 that are the same or similar to those of FIG. 3 are designated with identical reference numerals and described in detail above. In the embodiment of FIG. 3, NMOS transistor 304 and 308 are selectively coupled in parallel with NMOS transistors in the first or second input stage, respectively. In the embodiment of FIG. 4, PMOS transistors 404 and 408 are selectively coupled in parallel to the PMOS transistors 134 and 138, respectively. The differential amplifier 400 operates similar to the differential amplifier 300 described above, including the addition of hysteresis as described above.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof.

What is claimed is:

1. An amplifier circuit having a differential input and an amplifier output, comprising:
   a first input stage having a first complementary transistor pair providing a first input and a first output, the first input being a first half of the differential input;
   a second input stage having a second complementary transistor pair providing a second input and a second output, the second input being a second half of the differential input;
   an output stage coupled to the first input stage and the second input stage and providing the amplifier output; and
   a transistor coupled in parallel to one transistor in one of the first complementary transistor pair or the second complementary transistor pair, wherein the transistor coupled in parallel is configured to provide a trip point shift such that a hysteresis can be provided for the amplifier circuit.

2. The amplifier circuit of claim 1, wherein the transistor comprises an N-channel metal oxide semiconductor (NMOS) transistor coupled in parallel to another NMOS transistor in the first complementary transistor pair or the second complementary transistor pair.

3. The amplifier circuit of claim 1, wherein the transistor comprises a P-channel metal oxide semiconductor (PMOS) transistor coupled in parallel to another PMOS transistor in the first complementary transistor pair or the second complementary transistor pair.

4. The amplifier circuit of claim 1, wherein the output stage comprises:
   a first output stage having a third input coupled to the first output and a third output providing a bias voltage; and
   a second output stage having a fourth input coupled to the second output and a fourth output, the fourth output being the amplifier output.

5. The amplifier circuit of claim 1, further comprising:
a current source configured to provide current to the first input stage and the second input stage.

6. An amplifier circuit having a differential input and an amplifier output, comprising:
   a first input stage having a first complementary transistor pair providing a first input and a first output, the first input being a first half of the differential input;
   a second input stage having a second complementary transistor pair providing a second input and a second output, the second input being a second half of the differential input;
   an output stage coupled to the first input stage and the second input stage and providing the amplifier output;
   a first hysteresis circuit coupled in parallel with one transistor in the first complementary transistor pair, the first hysteresis circuit including a first transistor;
   a second hysteresis circuit coupled in parallel with one transistor in the second complementary transistor pair, the second hysteresis circuit including a second transistor; and
   a control circuit configured to selectively enable either the first transistor or the second transistor in response to the amplifier output.

7. The amplifier circuit of claim 6, wherein the first hysteresis circuit includes a first switch in series with the first transistor, and the second hysteresis circuit includes a second switch in series with the second transistor.

8. The amplifier circuit of claim 7, wherein the control circuit selectively enables either the first transistor or the second transistor by selectively activating either the first switch or the second switch, respectively.

9. The amplifier circuit of claim 6, wherein:
   the control circuit comprises first and second logic gates having outputs coupled to first and second inverters, respectively; and
   first inputs of the first and second logic gates receive the amplifier output and a logical inversion of the amplifier output, respectively.

10. The amplifier circuit of claim 9, wherein second inputs of the first and second logic gates receive a hysteresis enable signal.

11. The amplifier circuit of claim 6, wherein the output stage comprises:
a first output stage having a third input coupled to the first output and a third output providing a bias voltage; and
   a second output stage having a fourth input coupled to the second output and a fourth output, the fourth output being the amplifier output.

12. The amplifier of claim 6, further comprising:
a current source configured to provide current to the first input stage and the second input stage.

13. An amplifier circuit having a differential input and an amplifier output, comprising:

means for providing a first input stage having a first input and a first output, the first input being a first half of the differential input;
means for providing a second input stage having a second input and a second output, the second input being a second half of the differential input;
means for providing an output stage having the amplifier output; and
means for effectively increasing a width of one transistor in one of the first complementary transistor pair or the second complementary transistor pair, wherein the one transistor is configured to provide a trip point shift such that a hysteresis can be provided for the amplifier circuit.

14. The amplifier circuit of claim 13, wherein the means for effectively increasing comprises an N-channel metal oxide semiconductor (NMOS) transistor coupled in parallel to another NMOS transistor.

15. The amplifier circuit of claim 13, wherein the means for effectively increasing comprises a P-channel metal oxide semiconductor (PMOS) transistor coupled in parallel to another PMOS transistor.

16. The amplifier circuit of claim 13, wherein the means for providing the amplifier output comprises:
means for providing a bias voltage.

17. The amplifier circuit of claim 13, further comprising:
means for providing current to the first input stage and the second input stage.

* * * * *